US012641882B2

(12) United States Patent
Yu

(10) Patent No.: US 12,641,882 B2
(45) Date of Patent: May 26, 2026

(54) ARRAY SUBSTRATES AND DISPLAY PANELS

(71) Applicant: Guangzhou China Star Optoelectronics Semiconductor Display Technology Co., LTD., Guangdong (CN)

(72) Inventor: Ping Yu, Guangdong (CN)

(73) Assignee: Guangzhou China Star Optoelectronics Semiconductor Display Technology Co., Ltd., Guangzhou (CN)

( * ) Notice: Subject to any disclaimer, the term of this patent is extended or adjusted under 35 U.S.C. 154(b) by 398 days.

(21) Appl. No.: 18/215,908

(22) Filed: Jun. 29, 2023

(65) Prior Publication Data

US 2024/0332312 A1 Oct. 3, 2024

(30) Foreign Application Priority Data

Mar. 29, 2023 (CN) .......................... 202310332949.0

(51) Int. Cl.
*H10D 86/60* (2025.01)
*G02F 1/1362* (2006.01)
*H10D 86/40* (2025.01)

(52) U.S. Cl.
CPC ....... *H10D 86/60* (2025.01); *G02F 1/136286* (2013.01); *H10D 86/441* (2025.01)

(58) Field of Classification Search
CPC . H10D 86/60; H10D 86/441; G02F 1/136286
See application file for complete search history.

(56) References Cited

U.S. PATENT DOCUMENTS

2009/0160748 A1* 6/2009 Kimura ............. G02F 1/134363
345/94
2019/0369449 A1 12/2019 Qin et al.

FOREIGN PATENT DOCUMENTS

JP 2009-150925 9/2009

OTHER PUBLICATIONS

Notice of Reasons for Refusal Dated Nov. 12, 2024 From the Japan Patent Office Re. Application No. 2023-203219 and Its Translation Into English. (7 Pages).

* cited by examiner

*Primary Examiner* — David Y Chung

(57) ABSTRACT

An array substrate includes a substrate, a first electrode layer, an insulation layer, and a second electrode layer disposed in sequence. The substrate includes a display area and a non-display area. The first electrode layer includes a first common electrode located in the display area. The second electrode layer includes multiple pixel electrodes located in the display area and multiple common electrode wirings. The multiple pixel electrodes are spaced apart from each other, and the common electrode wiring is disposed between at least two adjacent pixel electrodes. An extension direction of the common electrode wiring is consistent with an extension direction of an edge of the adjacent pixel electrode.

16 Claims, 6 Drawing Sheets

151

1611 161 162

1

ARRAY SUBSTRATES AND DISPLAY PANELS

CROSS-REFERENCE TO RELATED APPLICATION

The present disclosure claims the priority to Chinese Patent Application No. 202310332949.0, filed on Mar. 29, 2023, the contents of which are incorporated herein by reference in its entirety.

TECHNICAL FIELD

The present disclosure relates to display technologies, and in particular to array substrates and display panels.

BACKGROUND

With the gradual development of display technologies, mainstream display technologies currently include liquid crystal displays, organic semiconductor displays, and quantum dot displays. With the increased demand, high refresh rate and high image quality are increasingly becoming essential elements of high-end electronic display products in the market. Liquid crystal display panels have advantages such as low power consumption and high image quality, and are gradually being favored. However, in existing array substrates of liquid crystal display panels, due to the gradual weakening of the electric field of edges of pixel electrodes, dark stripes are generated at the edges of the pixel electrodes, which leads to a decrease in the overall transmittance of the array substrate and thus affects the display quality of the display panels.

SUMMARY

The embodiments of the present disclosure provide an array substrate. The array substrate includes a substrate, a first electrode layer, an insulation layer, and a second electrode layer. A substrate includes a display area and a non-display area. A first electrode layer is disposed on the substrate and includes a first common electrode located in the display area. An insulation layer is disposed on a side of the first electrode layer away from the substrate. A second electrode layer is disposed on a side of the insulation layer away from the first electrode layer. The second electrode layer includes a plurality of pixel electrodes spaced apart from each other and a plurality of common electrode wirings, and the pixel electrodes and the common electrode wirings are located in the display area. One of the common electrode wirings is provided between at least adjacent two of the pixel electrodes and insulated from the adjacent two of the pixel electrodes, and an extension direction of one of the common electrode wirings is consistent with an extension direction of an edge of adjacent one of the pixel electrodes.

Correspondingly, the embodiments of the present disclosure further provide a display panel, and the display panel includes the array substrate in the above embodiments.

BRIEF DESCRIPTION OF THE DRAWINGS

To describe the technical solutions of the embodiments of the present disclosure more clearly, the following briefly introduces the accompanying drawings used in the description of the embodiments of the present disclosure. Apparently, the accompanying drawings described below illustrate only some exemplary embodiments of the present disclosure, and persons skilled in the art may derive other drawings from the drawings without making creative efforts.

Figure 1:
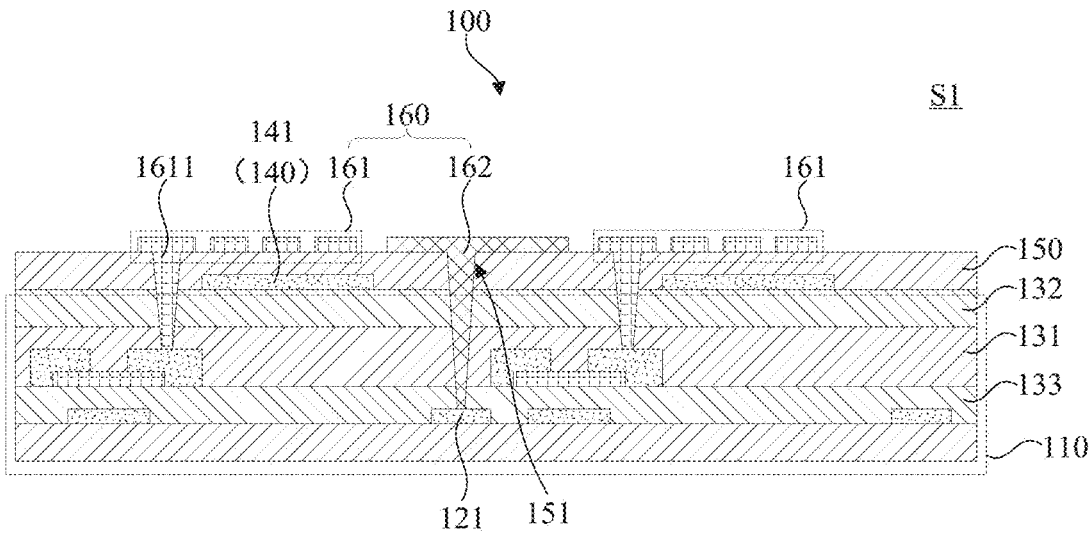

FIG. 1 is a schematic view of a display area of an array substrate provided by an embodiment of the present disclosure.

Figure 2:
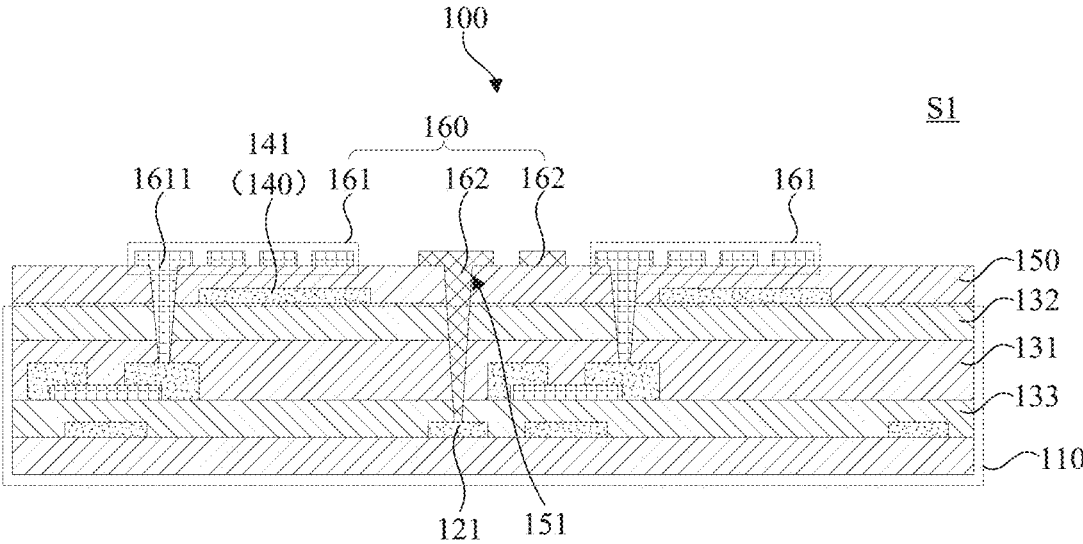

FIG. 2 is a schematic view of a display area of another array substrate provided by an embodiment of the present disclosure.

Figure 3:
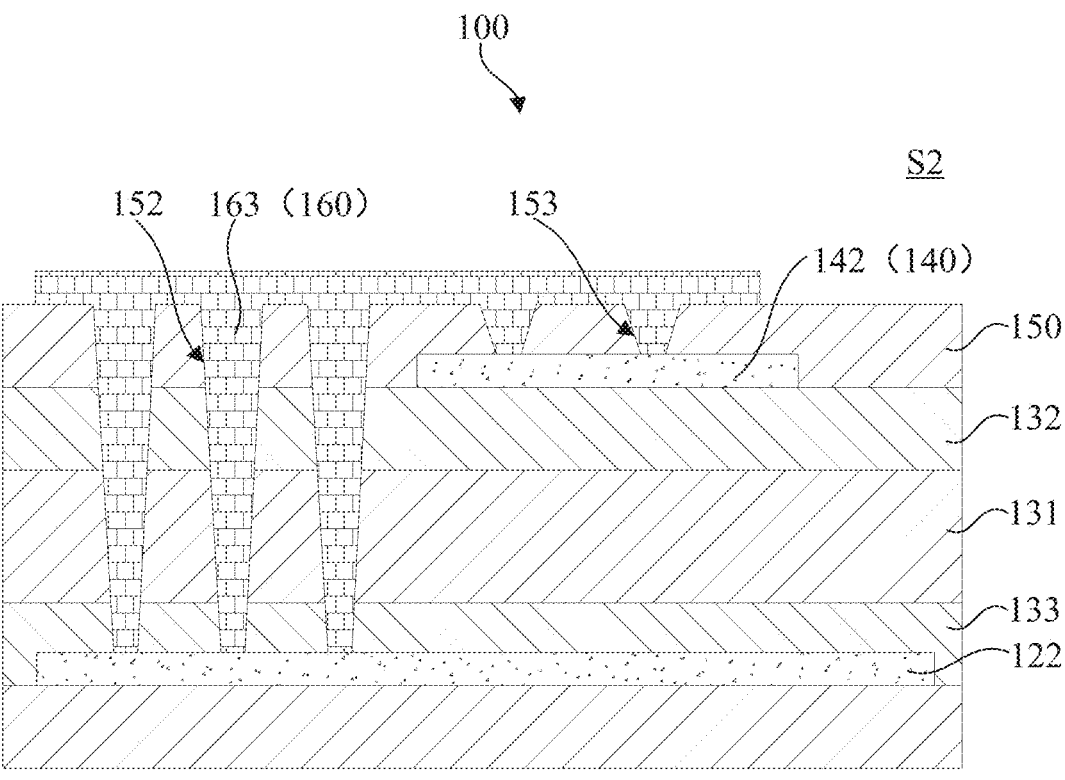

FIG. 3 is a schematic view of a non-display area of an array substrate provided by an embodiment of the present disclosure.

Figure 4:
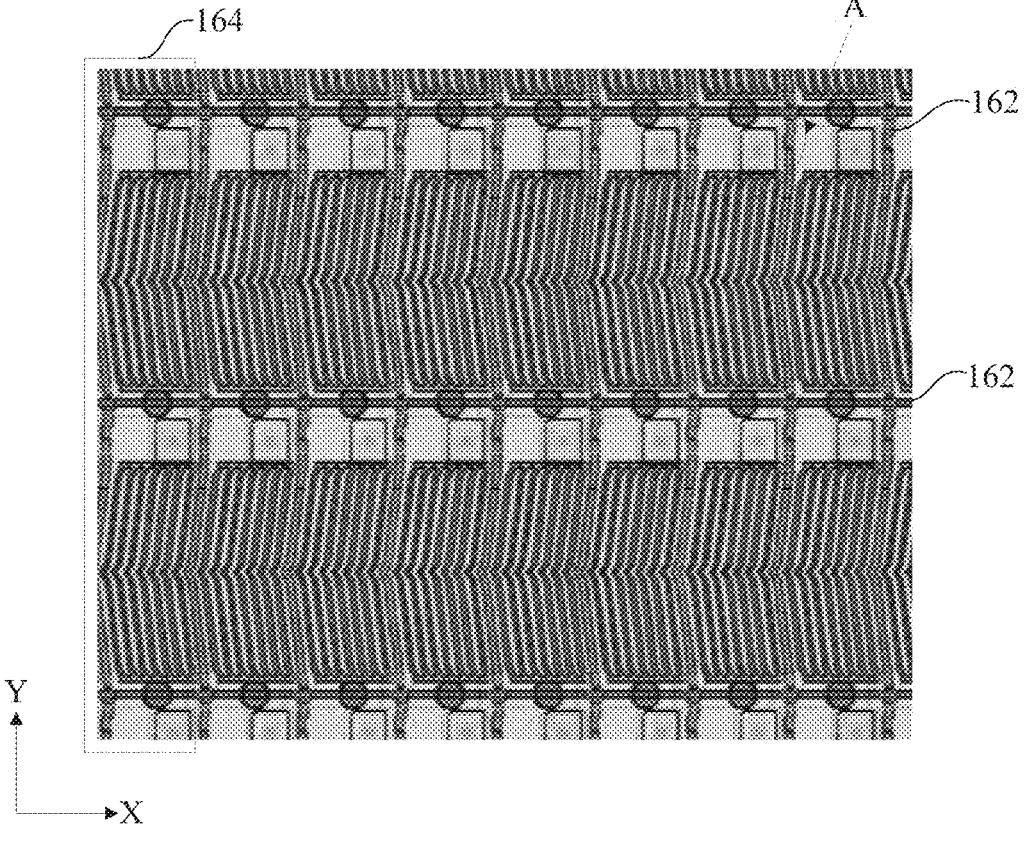

FIG. 4 is a schematic view of a distribution of pixel electrodes of an array substrate provided by an embodiment of the present disclosure.

Figure 5:
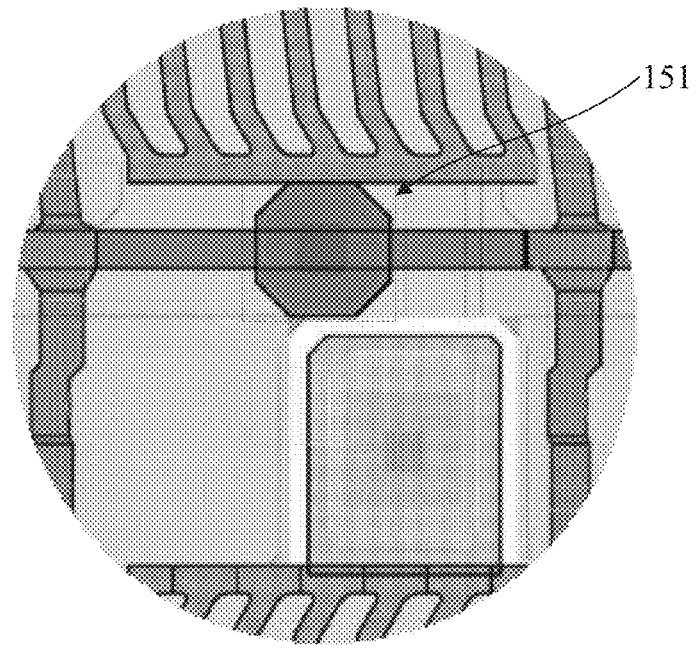

FIG. 5 is a schematic view of an enlarged structure of area A in FIG. 4 provided by an embodiment of the present disclosure.

Figure 6:
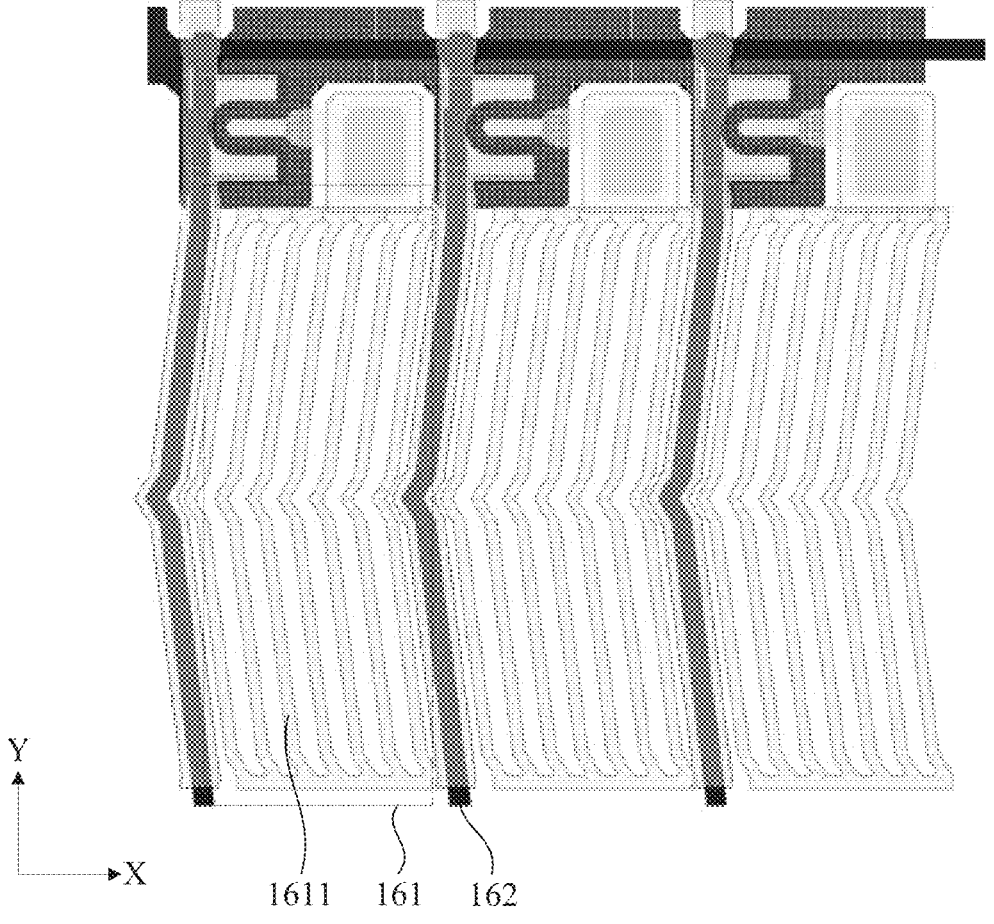

FIG. 6 is a schematic view of a row of pixel electrodes of an array substrate provided by an embodiment of the present disclosure.

Figure 7:
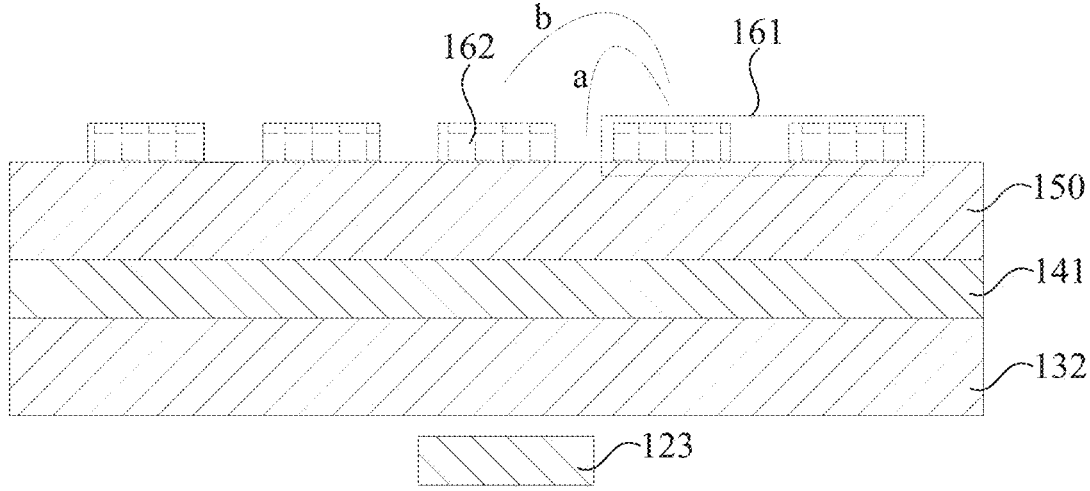

FIG. 7 is a comparative schematic view of electric field distributions of an edge of pixel electrodes of an array substrate provided by an embodiment of the present disclosure.

Figure 8:
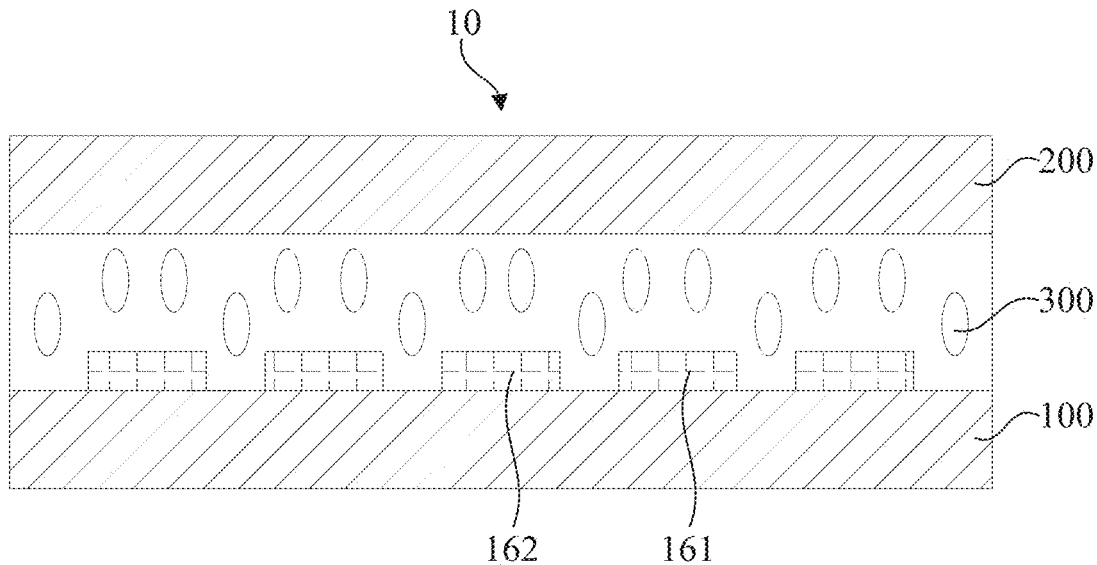

FIG. 8 is a schematic view of a display panel provided by an embodiment of the present disclosure.

Description of reference signs in the accompanying drawings:

| reference sign | component name | reference sign | component name |
|---|---|---|---|
| 10 | display panel | 150 | insulation layer |
| 100 | array substrate | 151 | first opening |
| 110 | substrate | 152 | second opening |
| S1 | display area | 153 | third opening |
| S2 | non-display area | 160 | second electrode layer |
| 121 | first signal line | 161 | pixel electrode |
| 122 | second signal line | 1611 | branch electrode |
| 123 | data line | 162 | common electrode wiring |
| 131 | passivation layer | 163 | connecting electrode |
| 132 | flattening layer | 164 | pixel electrode group |
| 133 | gate insulation layer | X | first direction |
| 140 | first electrode layer | Y | second direction |
| 141 | first common electrode | 200 | color film substrate |
| 142 | second common electrode | 300 | liquid crystal layer |

DETAILED DESCRIPTION

The technical solutions in the embodiments of the present disclosure will be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure. In addition, it should be understood that the specific implementation methods described here are only for the purpose of describing and explaining the present disclosure, and are not intended to limit the present disclosure. In the present disclosure, directional words used, such as "up" and "down", generally refer to the up and down positions of the device in actual use or working state, specifically the surface direction in the accompanying drawings, unless otherwise specified. And "inside" and "outside" are for the outline of the device.

The embodiments of the present disclosure provide an array substrate and a display panel, which are described in detail below. It should be noted that the description order of the following embodiments does not serve as a limitation on the preferred order of the embodiments.

Firstly, an embodiment of the present disclosure provides the array substrate, as shown in FIGS. 1 to 3. The array substrate 100 includes a substrate 110, which serves as a support structure for the array substrate 100 and is used to support other functional structural layers of the array substrate 100 to ensure the structural stability of the array substrate 100. The substrate 110 includes a display area S1 and a non-display area S2. The non-display area S2 serves as a signal input area for inputting control signals to the display area S1 to control the display of the screen in the display area S1.

As shown in FIG. 1, the array substrate 100 includes a first electrode layer 140, which is disposed on the substrate 110. The first electrode layer 140 includes a first common electrode 141 located in the display area S1, the first common electrode 141 is used to couple with the pixel electrode 161 to form an electric field and control the liquid crystal deflection to achieve the control function of the array substrate 100.

The array substrate 100 includes an insulation layer 150, which is located on a side of the first electrode layer 140 away from the substrate 110. The insulation layer 150 is used to separate the first electrode layer 140 from subsequent functional layers, avoiding interference between them and thus affecting the normal use of the array substrate 100.

The array substrate 100 includes a second electrode layer 160, which is disposed on a side of the insulation layer 150 away from the first electrode layer 140. The second electrode layer 160 includes a plurality of pixel electrodes 161 located in the display area S1 and a plurality of common electrode wirings 162. The plurality of pixel electrodes 161 are spaced apart from each other. The common electrode wiring 162 is disposed between at least two adjacent pixel electrodes 161. When inputting a signal, an electric field in an edge area of the pixel electrode 161 may gradually weaken, resulting in a dark stripe area. A formation of the dark stripe area may directly affect the overall transmittance of the array substrate 100, thereby affecting the display quality. By disposing the common electrode wiring 162 between the two adjacent pixel electrodes 161, the common electrode wiring 162 may react with an adjacent pixel electrode 161 when inputting a signal to enhance the electric field intensity of the edge of the corresponding pixel electrode 161, thereby improving the dark stripe of the edge of the pixel electrode 161 and increasing the transmittance of the array substrate 100.

It should be noted that in the embodiment of the present disclosure, the common electrode wiring 162 and the pixel electrode 161 are disposed on the same film layer, and the common electrode wiring 162 and the first common electrode 141 are disposed on different film layers. However, input signals applied to the first common electrode 141 and the common electrode wiring 162 are the same, that is, during the use of the array substrate 100, the input signal applied to the first common electrode 141 are used to regulate the display mode, and the input signal applied to the common electrode wiring 162 is used to enhance the edge electric field of the adjacent pixel electrodes 161 that have gradually weakened, enabling a same signal to achieve two functions, thereby simplifying the signal input method on the array substrate 100.

The extension direction of the common electrode wiring 162 is consistent with the extension direction of a corresponding edge of the adjacent pixel electrode 161, that is, when the input signal is applied, the electric field reaction between the common electrode wiring 162 and the corresponding edge of the adjacent pixel electrode 161 may keep consistent in the extension direction, thereby improving the uniformity of the electric field intensity change of the corresponding edge of the pixel electrode 161 and further improving the transmittance of the array substrate 100.

It should be noted that as shown in FIG. 6, the pixel electrode 161 includes a first bending area, and the common electrode wiring 162 located between two adjacent pixel electrodes 161 includes a second bending area which corresponds to the first bending area. A structural shape of the second bending area is consistent with a structural shape of the first bending area, that is, the extension direction of the common electrode wiring 162 is consistent with the extension direction of the edge of adjacent pixel electrodes 161. It can be understood that the consistent extension direction described in the embodiments of the present disclosure refers to the consistent extension direction of the common electrode wiring 162 and an adjacent edge contour of the pixel electrode 161, so that the distance between the common electrode wiring 162 and the adjacent pixel electrode 161 in the extension direction is equal everywhere, so that the electric field reaction between the common electrode wiring 162 and the corresponding edge of the adjacent pixel electrode 161 is capable of being consistent in the extension direction when applying the input signal, thereby improving the uniformity of the electric field intensity changes of the corresponding edge of the pixel electrode 161, effectively reducing the area of the dark stripe area while improving the distribution uniformity of the dark stripe area, and improving the overall transmittance of the array substrate 100.

In some embodiments of the present disclosure, the array substrate 100 includes the substrate 110, the first electrode layer 140, the insulation layer 150, and the second electrode layer 160 disposed in sequence. The substrate 110 includes the display area S1 and the non-display area S2. The first electrode layer 140 includes the first common electrode 141 located in the display area S1. The second electrode layer 160 includes a plurality of the pixel electrodes 161 located in the display area S1 and a plurality of the common electrode wiring 162, and the plurality of the pixel electrodes 161 are spaced apart from each other. The common electrode wiring 162 is disposed between at least two adjacent pixel electrodes 161, and the extension direction of the common electrode wiring 162 is consistent with the extension direction of the corresponding edge of the adjacent pixel electrodes 161. The common electrode wiring 162 is disposed between at least two adjacent pixel electrodes 161, which makes sure that the common electrode wiring 162 may react with the adjacent pixel electrodes 161 to enhance the electric field intensity of the edge of the corresponding pixel electrode 161 when applying the input signal, thereby improving the dark stripe of the edge of the pixel electrode 161 and increasing the transmittance of the array substrate 100.

In some embodiments, a common electrode wiring 162 is disposed between any two adjacent pixel electrodes 161, that is, when the plurality of the pixel electrodes 161 are disposed in an array, the common electrode wirings 162 are also disposed in an array to form a mesh structure, so that a common electrode wiring 162 is disposed between each two pixel electrodes 161, so that the electric field intensity of at least two edges of each pixel electrode 161 is capable of being enhanced when applying the input signal, thereby improving the overall dark stripe and increasing the transmittance of the array substrate 100.

Optionally, as shown in FIG. 4, the second electrode layer 160 includes a plurality of pixel electrode groups 164 disposed in parallel along the first direction X. Each pixel electrode group 164 includes a plurality of pixel electrodes 161 disposed in parallel along the second direction Y, and the second direction intersects with the first direction. That is, taking the first direction X as a row direction and the second direction Y as a column direction as an example, the plurality of the pixel electrodes 161 are disposed in an array. A plurality of pixel electrodes 161 in each column forming a pixel electrode group 164, and a plurality of pixel electrode groups 164 are distributed in a row.

At least one common electrode wiring 162 is provided between two adjacent pixel electrode groups 164, and an extension direction of the common electrode wiring 162 is consistent with an extension direction of an edge of the adjacent pixel electrode group 164. That is to say, the common electrode wiring 162 is disposed between two adjacent columns of pixel electrodes 161, and the extension direction of the common electrode wiring 162 is consistent with an extension direction of an edge of the adjacent column of pixel electrodes 161, so that one common electrode wiring 162 may simultaneously improve the uniformity of the electric field intensity changes of the edges of two adjacent entire column of pixel electrodes 161, effectively reducing the area of the dark stripe area of the edge of the entire column of pixel electrodes 161, thus improving the overall transmittance of the array substrate 100.

In some embodiments, any a pixel electrode group 164 is provided with a common electrode wiring 162 on opposite sides in the first direction X. That is, taking a plurality of pixel electrode groups 164 as a whole, a common electrode wiring 162 is further disposed on the opposite sides of the whole in the first direction X to improve the dark stripe in the edge area of the display area S1 of the array substrate 100 in the first direction X, thereby improving the transmittance of the array substrate 100 and improving display quality.

It should be noted that relative disposition positions of the common electrode wirings 162 and the pixel electrodes 161 may be adjusted according to the actual situation, and there are no special restrictions here. The common electrode wiring 162 may be only provided in areas with obvious dark stripe, but it may be omitted for areas without obvious dark stripe to reduce the number of common electrode wirings 162, which may reduce the difficulty of the process and save costs.

Optionally, distances between a common electrode wiring 162 and edges of adjacent two pixel electrode groups 164 are equal, that is, the common electrode wiring 162 is located in a central area of a gap between the adjacent two pixel electrode groups 164, so that the electric field reactions between the common electrode wiring 162 and the adjacent two pixel electrode groups 164 are consistent when applying the input signal, thereby improving the uniformity of the electric field intensity change of the edge of the pixel electrode group 164, to further improve the uniformity of the transmittance of the array substrate 100 and thereby improve display quality.

As shown in FIG. 6, in some embodiments, the pixel electrodes 161 includes a plurality of branch electrodes 1611 spaced apart from each other along the first direction X. An extension direction of the branch electrodes 1611 is consistent with an extension direction of the common electrode wiring 162, that is, a distribution direction of the plurality of the branch electrodes 1611 of each pixel electrode 161 is consistent with the distribution direction of the plurality of the pixel electrode groups 164, and the extension direction of the branch electrode 1611 is consistent with the extension direction of the edge of the pixel electrode group 164. The plurality of the branch electrodes 1611 are electrically connected to each other, forming a pixel electrode 161.

A first distance is defined between an edge of the pixel electrode group 164 and an adjacent common electrode wiring 162. A second distance is defined between adjacent two branch electrodes 1611 of the pixel electrode 161. The first distance is equal to the second distance, that is, distances between all gaps in the first direction X are equal. On the one hand, due to the fact that the common electrode wirings 162 and the pixel electrodes 161 are located on a same film layer and formed by a same mask, and the distances between all gaps are equal, the mask design of the second electrode layer 160 is capable of being simplified, and production efficiency is further improved. On the other hand, if both the branch electrode 1611 and the common electrode wiring 162 are regarded as a signal line, and the first distance is disposed to be equal to the second distance, a distance between any two signal lines may be equal. The electric field reaction between any two signal lines may be consistent when applying the input signal, so that the electric field intensity distribution may be consistent, which may effectively reduce the area of the dark stripe area while improving the distribution uniformity of the dark stripe area, thus improving the uniformity of transmittance and enhances display quality.

In other embodiments, as shown in FIG. 2, two common electrode wirings 162 spaced apart from each other are provided in the first direction X between two adjacent pixel electrode groups 164. When applying the input signal, the electric field reactions are generated between two adjacent pixel electrode groups 164 and their respective adjacent common electrode wirings 162 to enhance the gradually weakening electric field between the two adjacent pixel electrode groups 164 while avoiding mutual interference. Furthermore, the area of the dark stripe area around the pixel electrode group 164 is reduced, effectively weakening the transmittance loss caused by the dark stripe area, and improving display quality.

In some other embodiments, a third distance is defined between the two adjacent common electrode wirings 162 which are located between the two adjacent pixel electrode groups 164, and the third distance is equal to the first distance. That is, the first distance, the second distance, and the third distance are all equal. That is, distances of all gaps are equal in the first direction X.

On the one hand, the common electrode wiring 162 is located on the same film layer and is formed by the same mask as the pixel electrode 161, and the distances between all gaps are disposed to be equal, which helps to simplify the mask design of the second electrode layer 160 and improve production efficiency. On the other hand, if both the branch electrode 1611 and the common electrode wiring 162 are regarded as a signal line, and the first distance, the second distance and the third distance are disposed to be equal, a distance between any two signal lines may be equal. the electric field reactions between any two signal lines may be consistent when applying the input signal, so that the electric field intensity distribution may be consistent, which may effectively reduce the area of the dark stripe area while improving the distribution uniformity of the dark stripe area, thereby improving the uniformity of transmittance and enhances display quality.

Optionally, when manufacturing the common electrode wiring 162, a width of the common electrode wiring 162 in the first direction X may be disposed to be greater than or equal to 4 microns and less than or equal to 5 microns. If the width of the common electrode wiring 162 in the first direction X is too small, it may increase the accuracy requirements of the process of the common electrode wiring 162, and increase the production difficulty and cost. If the width of the common electrode wiring 162 in the first direction X is too large, it may cause the distance between the common electrode wiring 162 and the adjacent pixel electrode group 164 to be too small, increasing the risk of contact between the common electrode wiring 162 and the adjacent pixel electrode group 164, which is not conducive to the electric field reaction between the common electrode wiring 162 and the adjacent pixel electrode group 164.

In the actual production process, the width of the common electrode wiring 162 in the first direction X may be disposed to be 4 microns, 4.2 microns, 4.5 microns, 4.8 microns, or 5 microns, etc. The specific width value may be adjusted according to the design requirements, and just ensuring that the width of the common electrode wiring 162 may effectively improve the dark stripe of the edges of adjacent pixel electrode groups 164 and improve the transmittance of the array substrate 100, There are no special restrictions here.

It should be noted that during the process of manufacturing the common electrode wiring 162, the number and width of the common electrode wiring 162 between two adjacent pixel electrode groups 164 may be designed and adjusted based on the distance between adjacent two electrode groups 164, the distance between adjacent two branch electrodes 1611 in one pixel electrode 161, and the manufacturing accuracy of the common electrode wiring 162, to ensure that the disposition of the common electrode wiring 162 could effectively improve the dark stripe of the edges of adjacent pixel electrode groups 164, and enhance the transmittance of the array substrate 100.

Optionally, as shown in FIGS. 1 and 5, the array substrate 100 includes a first signal line 121 disposed in the display area S1, a first opening 151 is defined in the insulation layer 150 corresponding to the first signal line 121, and the common electrode wiring 162 is electrically connected to the first signal line 121 through the first opening 151. The array substrate 100 further includes a source and a drain disposed in the display area S1. The pixel electrode 161 is electrically connected to the drain. During the use of the array substrate 100, the input signal is applied to the common electrode wiring 162 by the first signal line 121 in the display area S1. By controlling a signal conduction between the source and the drain to apply the input signal to the pixel electrode 161, an electric field reaction is generated between the common electrode wiring 162 and the adjacent pixel electrode 161, thereby effectively improving the dark stripe of the edges of the adjacent pixel electrodes 161 and enhancing the transmittance of the array substrate 100.

As shown in FIG. 3, the array substrate 100 includes a second signal line 122 disposed in the non-display area S2. The second signal line 122 is disposed on the same layer as the first signal line 121. The first electrode layer 140 includes a second common electrode 142 located in the non-display area S2. The second common electrode 142 is electrically connected to the first common electrode 141. The second electrode layer 160 includes a connecting electrode 163 located in the non-display area S2. When manufacturing the array substrate 100, a first signal line 121 and a second signal line 122 are simultaneously formed by a same photomask. The first common electrode 141 and the second common electrode 142 are electrically connected and formed by a same photomask, and the pixel electrode 161, the common electrode wiring 162, and the connecting electrode 163 are simultaneously formed by a same photomask.

A second opening 152 is defined in the insulation layer 150 corresponding to the second signal line 122, and the connecting electrode 163 is electrically connected to the second signal line 122 through the second opening 152. A third opening 153 is defined in the insulation layer 150 corresponding to the second common electrode 142, and the connecting electrode 163 is electrically connected to the second common electrode 142 through the third opening 153. That is to say, the first common electrode 141 is electrically connected to the second signal line 122 through the second common electrode 142 and the connecting electrode 163, so that when the array substrate 100 is in use, the input signal is transmitted to the connecting electrode 163 by the second signal line 122 of the non-display area S2, and then transmitted to the second common electrode 142 by the connecting electrode 163, and finally transmitted to the first common electrode in the display area S1 by the second common electrode 142 to achieve regulation of the display mode of the display area S1.

It can be understood that the substrate 110 includes a substrate layer, a signal layer (including the first signal line 121 and the second signal line 122), a gate insulation layer 133, a data line 123, a passivation layer 131, and a flattening layer 132 disposed in sequence. Correspondingly, the first opening 151 and the second opening 152 sequentially penetrate the insulation layer 150, the flattening layer 132, the passivation layer 131, and the gate insulation layer 133, while the third opening 153 penetrates the insulation layer 153.

It should be noted that when using the array substrate 100, the input signals applied to the first common electrode 141 and the common electrode wiring 162 located in the display area S1 are both transmitted from the signal lines (not shown in the FIG.) in the non-display area S2. The input signal applied to the common electrode wiring 162 is directly transmitted from the signal line in the non-display area S2 to the first signal line 121, and then transmitted from the first signal line 121 to the common electrode wiring 162. The input signal on the first common electrode 141 is firstly transmitted from the signal line in the non-display area S2 to the second signal line 122, and then transmitted from the second signal line 122 to the connecting electrode 163, and then transmitted from the connecting electrode 163 to the second common electrode 142, and then transmitted from the second common electrode 142 to the first common electrode 141.

Specifically, FIG. 7 is a comparative schematic view of electric field distributions of an edge of pixel electrodes of an array substrate provided by an embodiment of the present disclosure. The solid line a represents a distribution of an electric field of the edge of the pixel electrode 161 when a common electrode path 162 is not provided between adjacent pixel electrodes 161. The dashed line b represents a distribution of the electric field of the edge of the pixel electrode 161 when a common electrode wiring 162 is provided between two adjacent pixel electrodes 161.

For fringe field switching (FFS) liquid crystal display technology, an electric field is formed by coupling the pixel electrode 161 and the first common electrode 141, causing oriented liquid crystal molecules to deflect in a plane direction parallel to the array substrate 100 under the action of the electric field, thereby improving the transparency efficiency of the liquid crystal layer 300, that is, the transmittance.

As shown in FIG. 7, when a common electrode wiring 162 is not provided between adjacent pixel electrodes 161, the electric field intensity between adjacent pixel electrodes 161 is in a state of gradually weakening, limiting the deflection of oriented liquid crystal molecules. More dark stripe areas may be generated by the edges of the pixel electrodes 161, resulting in a decrease in the transmittance of the array substrate 100. When a common electrode wiring 162 is provided between two adjacent pixel electrodes 161, during the process of applying the input signal, an electric field reaction may be generated between the common electrode wiring 162 and the adjacent pixel electrodes 161, which enhances the originally weakened electric field intensity and helps oriented liquid crystal molecules deflect under the action of the electric field, thereby improving the transparency efficiency of the liquid crystal layer 300.

As shown in FIG. 7, the array substrate 100 further includes a plurality of data lines 123 disposed in the display area S1. An orthographic projection of the common electrode wiring 162 on the substrate 110 overlap at least partially with an orthographic projection of the data line 123 on the substrate 110. That is, in a thickness direction of the array substrate 100, the common electrode wiring 162 and the data line 123 are stacked in layers, and the common electrode wiring 162 is located between two adjacent pixel electrodes 161. Thus, the common electrode wiring 162 may shield the capacitive coupling between the data line 123 and the pixel electrode 161, thereby improving the overall display effect of the array substrate 100.

Secondly, the embodiments of the present disclosure further provide a display panel, which includes the array substrate. The specific structure of the array substrate refers to the above embodiments. As the display panel adopts all the technical solutions of the above embodiments, the display panel should have at least all the beneficial effects brought by the technical solutions of the above embodiments, and the beneficial effects are not repeated here.

As shown in FIG. 8, the display panel 10 includes the array substrate 100, a color film substrate 200 and a liquid crystal layer 300. The color film substrate 200 is located on a side of the second electrode layer 160 of the array substrate 100 away from the substrate 110 of the array substrate 100. The color film substrate 200 is opposite to the array substrate 100. When assembling the display panel 10, the array substrate 100 and the color film substrate 200 buckle together to form a cavity, and the liquid crystal layer 300 is filled in the cavity between the color film substrate 200 and the array substrate 100. During a working process of the display panel 10, by regulating a driving signal applied to the array substrate 100, the liquid crystal molecules in the liquid crystal layer 300 deflect to change the emitted light angle and form different display screens.

For the fringe field switching (FFS) liquid crystal display technology, an electric field is formed by coupling the pixel electrode 161 and the first common electrode 141, causing oriented liquid crystal molecules to deflect in the plane direction parallel to the array substrate 100 under the action of the electric field, thereby improving the light transmission efficiency of the liquid crystal layer 300.

Specifically, the array substrate 100 includes the substrate 110, the first electrode layer 140, the insulation layer 150, and the second electrode layer 160 disposed in sequence. The substrate 110 includes the display area S1 and the non-display area S2. The first electrode layer 140 includes the first common electrode 141 located in the display area S1. The second electrode layer 160 includes a plurality of the pixel electrodes 161 located in the display area S1 and a plurality of the common electrode wiring 162, and the plurality of the pixel electrodes 161 are spaced apart from each other. The common electrode wiring 162 is disposed between at least two adjacent pixel electrodes 161, and the extension direction of the common electrode wiring 162 is consistent with the extension direction of the corresponding edge of the adjacent pixel electrodes 161. The common electrode wiring 162 is disposed between at least two adjacent pixel electrodes 161, which makes sure that the common electrode wiring 162 may react with the adjacent pixel electrodes 161 to enhance the electric field intensity of the edge of the corresponding pixel electrode 161 when applying the input signal, thereby improving the dark stripe of the edge of the pixel electrode 161 and increasing the transmittance of the array substrate 100.

It should be noted that the application scope of the display panel 10 provided by the embodiments of the present disclosure is very wide, including various display and lighting devices such as televisions, computers, mobile phones, foldable and curly displays, as well as wearable devices such as smart wristbands and smartwatches, all of which are within the application scope of the display panel 10 provided by the embodiments of the present disclosure.

The embodiments of the present disclosure further provide a display device, which includes the display panel. The specific structure of the display panel refers to the above embodiments. As the display device adopts all the technical solutions of the above embodiments, the display device should have at least all the beneficial effects brought by the technical solutions of the above embodiments, and the beneficial effects are not repeated here.

The display device includes the display panel 10, a control circuit, and a shell. The shell is connected to the display panel 10 to support and fix the display panel 10, the control circuit is disposed inside the shell, and the control circuit is electrically connected to the display panel 10 to control the display panel 10 for image display.

The display panel 10 may be fixed to the shell, forming an integral part with the shell. The display panel 10 and the shell form a closed space to accommodate the control circuit. The control circuit may be a motherboard of the display device. The control circuit may further integrate one or more functional components such as batteries, an antenna structure, a microphone, a speaker, a headphone interface, an universal serial bus interface, a camera, a distance sensor, an ambient light sensor, and a processor, to make the display device suitable for various application fields.

It should be noted that the display device is not limited to the above content. the display device may include other components, such as fingerprint unlocking modules, etc., to expand its scope of use. There are no restrictions here.

The above provides a detailed introduction to the array substrate and the display panel provided by the embodiments of the present disclosure. The principle and implementations of the present disclosure are described in this specification by using specific examples. The description about the foregoing embodiments is merely provided to help understand the method and core ideas of the present disclosure. In addition, persons of ordinary skill in the art can make modifications in terms of the specific implementations and application scopes according to the ideas of the present disclosure. Therefore, the content of this specification shall not be construed as a limit to the present disclosure.

What is claimed is:

1. An array substrate, comprising:

a substrate comprising a display area and a non-display area;

a first electrode layer disposed on the substrate and comprising a first common electrode located in the display area;

an insulation layer disposed on a side of the first electrode layer away from the substrate;

a second electrode layer disposed on a side of the insulation layer away from the first electrode layer; wherein the second electrode layer comprises a plurality of pixel electrodes spaced apart from each other and a plurality of common electrode wirings, the pixel electrodes and the common electrode wirings are located in the display area, one of the common electrode wirings is provided between at least adjacent two of the pixel electrodes and insulated from the adjacent two of the pixel electrodes, and an extension direction of one of the common electrode wirings is consistent with an extension direction of an edge of adjacent one of the pixel electrodes;

a first signal line disposed in the display area, wherein a first opening is defined in the insulation layer corresponding to the first signal line, and one of the common electrode wirings is electrically connected to the first signal line through the first opening; and a second signal line disposed in the non-display area, wherein the second signal line is disposed on a same layer as the first signal line, the first electrode layer comprises a second common electrode located in the non-display area, the second common electrode is electrically connected to the first common electrode, the second electrode layer comprises a connecting electrode located in the non-display area, a second opening is defined in the insulation layer corresponding to the second signal line, the connecting electrode is electrically connected to the second signal line through the second opening, a third opening is defined in the insulation layer corresponding to the second common electrode, and the connecting electrode is electrically connected to the second common electrode through the third opening.

2. The array substrate of claim 1, wherein one of the common electrode wirings is provided between any adjacent two of the pixel electrodes.

3. The array substrate of claim 1, wherein the second electrode layer comprises a plurality of pixel electrode groups disposed in parallel along a first direction, each of the pixel electrode groups comprises a plurality of pixel electrodes disposed in parallel along a second direction, the second direction intersects with the first direction, at least one of the common electrode wiring is provided between adjacent two of the pixel electrode groups, and the extension direction of one of the common electrode wirings is consistent with an extension direction of an edge of adjacent one of the pixel electrode groups.

4. The array substrate of claim 3, wherein distances between one of the common electrode wirings and edges of the adjacent two of the pixel electrode groups are equal.

5. The array substrate of claim 3, wherein each of the pixel electrodes comprises a plurality of branch electrodes spaced apart from each other along the first direction, and an extension direction of each of the branch electrodes is consistent with an extension direction of corresponding one of the common electrode wirings, a first distance is defined between an edge of one of the pixel electrode groups and adjacent one of the common electrode wirings, a second distance is defined between adjacent two of the branch electrodes of one of the pixel electrodes, and the first distance is equal to the second distance.

6. The array substrate of claim 3, wherein a width of each of the common electrode wirings in the first direction is greater than or equal to 4 microns and less than or equal to 5 microns.

7. The array substrate of claim 1, wherein the array substrate further comprises a plurality of data lines disposed in the display area, and an orthographic projection of one of the common electrode wirings on the substrate overlaps at least partially with an orthographic projection of corresponding one of the data lines on the substrate.

8. The array substrate of claim 1, wherein an edge of the display area adjacent to the non-display area is correspondingly provided with one of the common electrode wirings.

9. A display panel comprising an array substrate, the array substrate comprising:

a substrate comprising a display area and a non-display area;

a first electrode layer disposed on the substrate and comprising a first common electrode located in the display area;

an insulation layer disposed on a side of the first electrode layer away from the substrate;

a second electrode layer disposed on a side of the insulation layer away from the first electrode layer; wherein the second electrode layer comprises a plurality of pixel electrodes spaced apart from each other and a plurality of common electrode wirings, the pixel electrodes and the common electrode wirings are located in the display area, one of the common electrode wirings is provided between at least adjacent two of the pixel electrodes and insulated from the adjacent two of the pixel electrodes, and an extension direction of one of the common electrode wirings is consistent with an extension direction of an edge of adjacent one of the pixel electrodes;

a first signal line disposed in the display area, wherein a first opening is defined in the insulation layer corresponding to the first signal line, and one of the common electrode wirings is electrically connected to the first signal line through the first opening; and a second signal line disposed in the non-display area, wherein the second signal line is disposed on a same layer as the first signal line, the first electrode layer comprises a second common electrode located in the non-display area, the second common electrode is electrically connected to the first common electrode, the second electrode layer comprises a connecting electrode located in the non-display area, a second opening is defined in the insulation layer corresponding to the second signal line, the connecting electrode is electrically connected to the second signal line through the second opening, a third opening is defined in the insulation layer corresponding to the second common electrode, and the connecting electrode is electrically connected to the second common electrode through the third opening.

10. The display panel of claim 9, wherein one of the common electrode wirings is provided between any adjacent two of the pixel electrodes.

11. The display panel of claim 9, wherein the second electrode layer comprises a plurality of pixel electrode groups disposed in parallel along a first direction, each of the pixel electrode groups comprises a plurality of pixel electrodes disposed in parallel along a second direction, the second direction intersects with the first direction, at least one of the common electrode wiring is provided between adjacent two of the pixel electrode groups, and the extension direction of one of the common electrode wirings is consistent with an extension direction of an edge of adjacent one of the pixel electrode groups.

12. The display panel of claim 11, wherein distances between one of the common electrode wirings and edges of the adjacent two of the pixel electrode groups are equal.

13. The display panel of claim 11, wherein each of the pixel electrodes comprises a plurality of branch electrodes spaced apart from each other along the first direction, and an extension direction of each of the branch electrodes is consistent with an extension direction of corresponding one of the common electrode wirings, a first distance is defined between an edge of one of the pixel electrode groups and adjacent one of the common electrode wirings, a second distance is defined between adjacent two of the branch electrodes of one of the pixel electrodes, and the first distance is equal to the second distance.

14. The display panel of claim 11, wherein a width of each of the common electrode wirings in the first direction is greater than or equal to 4 microns and less than or equal to 5 microns.

15. The display panel of claim 9, wherein the array substrate further comprises a plurality of data lines disposed in the display area, and an orthographic projection of one of the common electrode wirings on the substrate overlaps at least partially with an orthographic projection of corresponding one of the data lines on the substrate.

16. The display panel of claim 9, wherein an edge of the display area adjacent to the non-display area is correspondingly provided with one of the common electrode wirings.

* * * * *